(12) United States Patent
von Malm

(10) Patent No.: US 9,589,939 B2
(45) Date of Patent: Mar. 7, 2017

(54) OPTOELECTRONIC SEMICONDUCTOR CHIP

(71) Applicant: OSRAM Opto Semiconductors GmbH, Regensburg (DE)

(72) Inventor: Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/407,891

(22) PCT Filed: May 27, 2013

(86) PCT No.: PCT/EP2013/060882
§ 371 (c)(1),
(2) Date: Dec. 12, 2014

(87) PCT Pub. No.: WO2013/186035
PCT Pub. Date: Dec. 19, 2013

(65) Prior Publication Data
US 2015/0194411 A1 Jul. 9, 2015

(30) Foreign Application Priority Data
Jun. 14, 2012 (DE) .......................... 10 2012 105 176

(51) Int. Cl.
*H01L 33/62* (2010.01)
*H01L 33/48* (2010.01)
(Continued)

(52) U.S. Cl.
CPC ...... *H01L 25/0753* (2013.01); *H01L 23/5386* (2013.01); *H01L 33/62* (2013.01);
(Continued)

(58) Field of Classification Search
CPC . H01L 25/0753; H01L 33/62; H01L 23/5386; H05K 1/0289
(Continued)

(56) References Cited

U.S. PATENT DOCUMENTS 8,238,112 B2 * 8/2012 Kim ..................... H05K 1/0295
361/761
8,823,024 B2 9/2014 Engl et al.
(Continued)

FOREIGN PATENT DOCUMENTS

DE 102008026841 A1 8/2009
DE 102008011848 A1 9/2009
(Continued)

*Primary Examiner* — Long K Tran
*Assistant Examiner* — Thai T Vuong
(74) *Attorney, Agent, or Firm* — Slater Matsil, LLP

(57) ABSTRACT

An optoelectronic semiconductor chip includes an interconnection layer with a first electrically conductive contact layer, a second electrically conductive contact layer and an insulation layer, which is formed of an electrically insulating material. Further, the optoelectronic semiconductor chip includes two optoelectronic semiconductor bodies, each of which include an active region that is intended to generate radiation. The insulation layer is arranged on a top of the second electrically conductive contact layer facing the optoelectronic semiconductor bodies. The first electrically conductive contact layer is arranged on a top of the insulation layer remote from the second electrically conductive contact layer. The optoelectronic semiconductor bodies are interconnected electrically in parallel by the interconnection layer.

18 Claims, 4 Drawing Sheets

(51) Int. Cl.
  *H01L 33/52* (2010.01)
  *H01L 31/18* (2006.01)
  *H01L 25/075* (2006.01)
  *H05K 1/02* (2006.01)
  *H01L 23/538* (2006.01)
  *H01L 33/38* (2010.01)

(52) U.S. Cl.
  CPC .......... *H05K 1/0289* (2013.01); *H01L 33/382* (2013.01); *H01L 2924/0002* (2013.01); *H05K 2201/0969* (2013.01); *H05K 2201/10106* (2013.01)

(58) Field of Classification Search
  USPC ................................................. 257/88, 98, 99
  See application file for complete search history.

(56) References Cited

U.S. PATENT DOCUMENTS

| | | | | |
|---|---|---|---|---|
| 2008/0035935 A1* | 2/2008 | Shum | ............... | H01L 33/382 257/79 |
| 2008/0303411 A1* | 12/2008 | Ohta | ............... | C09K 11/02 313/503 |
| 2009/0065800 A1* | 3/2009 | Wirth | ............... | H01L 31/022408 257/100 |
| 2009/0072250 A1* | 3/2009 | Inoue | ............... | H01L 25/0753 257/88 |
| 2010/0181582 A1* | 7/2010 | Li | ............... | H01L 33/44 257/91 |
| 2010/0276706 A1* | 11/2010 | Herrmann | ............... | H01L 33/0079 257/89 |
| 2010/0289095 A1* | 11/2010 | Poeppel | ............... | H01L 23/3128 257/414 |
| 2011/0104836 A1* | 5/2011 | Rode | ............... | H01L 33/22 438/29 |
| 2011/0108870 A1* | 5/2011 | Jaeger | ............... | H05K 1/0366 257/98 |
| 2011/0136271 A1* | 6/2011 | von Malm | ............... | H01L 33/0079 438/15 |
| 2011/0233587 A1* | 9/2011 | Unno | ............... | H01L 33/382 257/98 |
| 2011/0233754 A1* | 9/2011 | Meyer-Berg | ............... | H01L 21/56 257/693 |
| 2011/0241031 A1 | 10/2011 | von Malm et al. | | |
| 2012/0018763 A1* | 1/2012 | Engl | ............... | H01L 27/15 257/99 |
| 2012/0126259 A1 | 5/2012 | Mizutani et al. | | |
| 2013/0119426 A1* | 5/2013 | Katoh | ............... | H01L 33/486 257/98 |
| 2014/0061703 A1 | 3/2014 | von Malm | | |

FOREIGN PATENT DOCUMENTS

| | | |
|---|---|---|
| DE | 102009030938 A1 | 1/2010 |
| DE | 102011015821 A1 | 10/2012 |
| JP | 2009048915 A | 3/2009 |

* cited by examiner

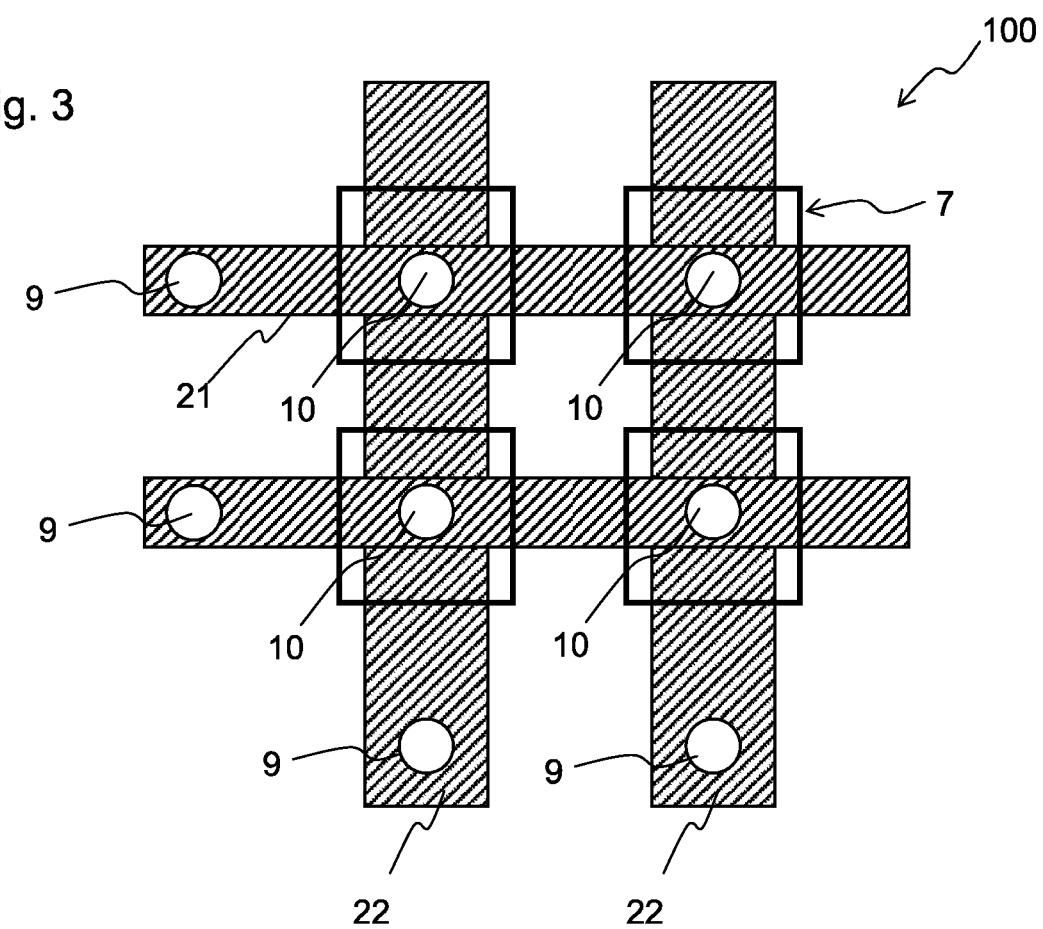

OPTOELECTRONIC SEMICONDUCTOR CHIP

This patent application is a national phase filing under section 371 of PCT/EP2013/060882, filed May 27, 2013, which claims the priority of German patent application 102012105176.3, filed Jun. 14, 2012, each of which is incorporated herein by reference in its entirety.

TECHNICAL FIELD

An optoelectronic semiconductor chip is provided.

BACKGROUND

It is difficult to provide an optoelectronic semiconductor chip which displays a low level of complexity in terms of its structure and is ageing-resistant.

SUMMARY

According to at least one embodiment, the optoelectronic semiconductor chip comprises an interconnection layer with a first electrically conductive contact layer and a second electrically conductive contact layer. The first electrically conductive contact layer and the second electrically conductive contact layer may fulfil the same role in terms of their functionality, but be differently constructed in terms of their material properties.

The first electrically conductive contact layer and the second electrically conductive contact layer of the interconnection layer are constructed to be electrically conductive and may for example comprise the same electrically conductive material or consist of the same electrically conductive material. Moreover, the first electrically conductive contact layer may comprise a different electrically conductive material or consist of a different electrically conductive material from the second electrically conductive contact layer.

According to at least one embodiment, the optoelectronic semiconductor chip comprises an interconnection layer with an insulation layer which is formed of an electrically insulating material. The insulation layer here for example comprises a plastics material, a ceramic and/or a material with a high specific resistance. For example, the electrically insulating material has a specific resistance greater than $10^{10}$ Ωm. In other words, the insulation layer comprises an electrically insulating material which is capable of electrically insulating the first electrically conductive contact layer from the second electrically conductive contact layer.

The insulation layer may in particular be thin. In this context, "thin" means that the vertical extent of the insulation layer is small compared with the maximum lateral extent of the insulation layer.

The insulation layer may for example insulate, space and/or enclose the first and second electrically conductive contact layers relative to one another. The insulation layer is in this respect in particular in direct contact with the first and/or second electrically conductive contact layer. "To be in direct contact" is understood in the present context to mean that the insulation layer is connected directly to the first and/or second electrically conductive contact layer and no further layer is arranged or formed between them.

According to at least one embodiment, the optoelectronic semiconductor chip comprises two optoelectronic semiconductor bodies, wherein each of the optoelectronic semiconductor bodies comprises an active region which is intended for generating radiation. The active region in this case generates in particular electromagnetic radiation. The term "electromagnetic radiation" may here and hereinafter mean electromagnetic radiation with at least one wavelength or one spectral component in an infrared to ultraviolet wavelength range. Infrared, visible and/or ultraviolet electromagnetic radiation may in particular be meant here.

According to at least one embodiment, the insulation layer of the optoelectronic semiconductor chip is arranged on a top of the second electrically conductive contact layer facing the optoelectronic semiconductor bodies. This means that the insulation layer terminates at least in places flush with the top of the second electrically conductive contact layer, in particular may be planar at least in places at the top of the second electrically conductive contact layer and/or adopts patterns on the top of the second electrically conductive contact layer. The insulation layer is then in direct contact with the top of the second electrically conductive contact layer facing the optoelectronic semiconductor bodies. In other words, in this case no further layer is present between the insulation layer and the top of the second electrically conductive contact layer facing the optoelectronic semiconductor bodies.

According to at least one embodiment of the optoelectronic semiconductor chip, the first electrically conductive contact layer is arranged on a top of the insulation layer remote from the second electrically conductive contact layer. This means that the insulation layer spaces the first electrically conductive layer from the second electrically conductive layer, wherein the first electrically conductive layer may be arranged at least in places parallel with the second electrically conductive layer. The insulation layer is in this case arranged such that the insulation layer is located at least in places between the first electrically conductive contact layer and the second electrically conductive contact layer.

According to at least one embodiment of the optoelectronic semiconductor chip, the optoelectronic semiconductor bodies are interconnected electrically in parallel with one another by the interconnection layer. "Interconnected in parallel" is understood in the present context to mean that the active regions of the optoelectronic semiconductor bodies are electrically contacted with one another in such a way that the active regions are in each case contacted jointly, concurrently and/or simultaneously via the first electrically conductive contact layer or via the second electrically conductive contact layer. In the parallel connection described here, for example either the first electrically conductive contact layer may be configured as a common anode or the second electrically conductive contact layer may be configured as a common cathode, wherein the optoelectronic semiconductor bodies are in each case electrically interconnected only by the common anode or common cathode. In other words, the optoelectronic semiconductor bodies are in each case only contacted electrically with one another by a common electrode of the same polarity.

According to at least one embodiment, the optoelectronic semiconductor chip comprises more than two, in particular a plurality of optoelectronic semiconductor bodies, which are interconnected at least in part in parallel.

According to at least one embodiment, the optoelectronic semiconductor chip comprises an interconnection layer with a first electrically conductive contact layer and a second electrically conductive contact layer as well as an insulation layer formed of an electrically insulating material, and comprises two optoelectronic semiconductor bodies, wherein each of the optoelectronic semiconductor bodies comprises an active region which is intended for generating radiation. The insulation layer of the optoelectronic semiconductor chip is arranged on a top of the second electrically conductive contact layer facing the optoelectronic semiconductor bodies. The first electrically conductive contact layer of the optoelectronic semiconductor chip is arranged on a top of the insulation layer remote from the second electrically conductive contact layer. The optoelectronic semiconductor bodies of the optoelectronic semiconductor chip are in this case interconnected electrically in parallel with one another by the interconnection layer.

The optoelectronic semiconductor chip described here is based inter alia on the recognition that in the case of electrical contacting between optoelectronic semiconductor bodies and a carrier, insulation layers of a complex geometry are necessary for contacting the p/n regions. The complex geometry of the insulation layer, which insulates the individual contact regions from one another, is however not very resistant to ageing and the associated production process for contacting the individual p/n regions of the optoelectronic semiconductor bodies often requires a lot of effort. In addition, such electrical insulation, which must adapt to complex structures within a carrier, displays current leaks after a relatively long period of operation. Electrical insulation produced in a complex manner may moreover display or develop cracks and fractures after a relatively long period of operation, which may result in electrical short circuits between the carrier and the optoelectronic semiconductor body.

To provide an optoelectronic semiconductor chip which displays a low level of complexity in terms of structure and is ageing-resistant, the optoelectronic semiconductor chip described here is based inter alia on the principle of providing an interconnection layer, in particular an insulation layer, which is constructed such that, in particular on a side of the interconnection layer facing the optoelectronic semiconductor bodies, electrically conductive contact layers and the insulation layer at least in places form planar faces, in particular a mounting face. The mounting face of the interconnection layer may be of planar construction, such that the electrically insulating regions in particular of the interconnection layer and the optoelectronic semiconductor bodies do not have to be complex and thereby display significantly better stability even after a long operating time. This means that in particular the insulation layer of the interconnection layer is of planar construction and in particular may be plane-parallel, coplanar, free of topographic features and/or not formed in such a way as to reproduce an underlying height profile.

According to at least one embodiment of the optoelectronic semiconductor chip, the interconnection layer is formed in planar manner on a mounting face of the interconnection layer facing the optoelectronic semiconductor bodies. "Planar" means in the present context that the interconnection layer is in its vertical extent in particular free of topographic features, free of height differences and/or does not reproduce an underlying height profile, within the bounds of manufacturing tolerances. Moreover, the interconnection layer does not have any steps, edges or other raised portions or depressions on the mounting face facing the optoelectronic semiconductor bodies. The roughness of the mounting face of the interconnection layer facing the semiconductor bodies may in this respect amount for example to at most 1% of the maximum vertical extent, i.e. the thickness, of the interconnection layer.

According to at least one embodiment of the optoelectronic semiconductor chip, the mounting face of the interconnection layer is formed with the outer faces, facing the optoelectronic semiconductor bodies, of the first electrically conductive contact layer, the second electrically conductive contact layer and the insulation layer. This means that the above-described planar mounting face of the interconnection layer is formed, assembled and/or fitted together from the electrically conductive materials of the first and second electrically conductive layer and the insulating material of the insulation layer. The resultant transitions between the electrically conductive and the electrically insulating materials are formed such that no raised portions and depressions are formed. The mounting face comprises electrically conductive and insulating regions, which differ from one another in particular with regard to their electrically conductive or insulating material properties but form the planar mounting face of the interconnection layer in a physically contiguous, seamless manner.

According to at least one embodiment of the optoelectronic semiconductor chip, the insulating regions of the mounting face are formed by at least one further electrically insulating material and/or the insulating regions are free of the electrically insulating and/or the further electrically insulating material. The further electrically insulating materials comprise in particular the materials: BCB, silicone resin and sol-gel materials, such as for example $SiO_2$, $Al_2O_3$ and/or $TiO_2$. "Free" means in the present context that the insulating regions of the mounting face are formed by cutouts, cavities and/or recesses, wherein the insulation layer of the interconnection layer may form a planar face parallel to the mounting face. "Planar" means in the present context that the insulation layer is in its vertical extent in particular free of topographic features, free of height differences and/or does not reproduce an underlying height profile, within the bounds of manufacturing tolerances.

According to at least one embodiment of the optoelectronic semiconductor chip, the surface, remote from the optoelectronic semiconductor bodies, of the second electrically conductive contact layer and the insulation layer is of planar construction. "Planar" means in the present context that the second electrically conductive contact layer and the insulation layer are in their vertical extent in particular free of topographic features, free of height differences and/or do not reproduce an underlying height profile, within the bounds of manufacturing tolerances, in terms of their surface remote from the optoelectronic semiconductor bodies.

According to at least one embodiment of the optoelectronic semiconductor chip, the interconnection layer is planar over an entire top facing the optoelectronic semiconductor bodies. The interconnection layer comprises the first electrically conductive contact layer, the second electrically conductive contact layer and the insulation layer, which forms the entire top facing the optoelectronic semiconductor bodies. In the present context, "entire top facing the optoelectronic semiconductor bodies" means that the top facing the optoelectronic semiconductor bodies is made only from the materials of the first electrically conductive contact layer, the second electrically conductive contact layer and the insulation layer and is planar. This means that at the top the first electrically conductive contact layer, the second electrically conductive contact layer and the insulation layer are in direct, seamless contact with one another over the entire top facing the optoelectronic semiconductor bodies and jointly define a planar face which is formed perpendicularly to and/or transversely of the vertical extent of the optoelectronic semiconductor chip.

According to at least one embodiment of the optoelectronic semiconductor chip, the mounting face of the interconnection layer consists of the outer faces, facing the optoelectronic semiconductor bodies, of the first electrically conductive contact layer, the second electrically conductive contact layer and the insulation layer. This means that the above-described planar mounting face of the interconnection layer is formed solely from the electrically conductive materials of the first and second electrically conductive layer and the insulating material of the insulation layer. The transitions between the electrically conductive and the electrically insulating materials are formed in such a way that no raised portions and depressions are detectable. The mounting face comprises electrically conductive and insulating regions, which differ from one another solely with regard to their electrically conductive or insulating material properties but form the planar mounting face of the interconnection layer in a mechanically contiguous, seamless manner.

According to at least one embodiment of the optoelectronic semiconductor chip, the interconnection layer is thin. In the present context, "thin" means that the vertical extent of the interconnection layer is many times smaller than the lateral extent thereof, within the bounds of manufacturing tolerances. To support or bear the optoelectronic semiconductor chip mechanically, it is in particular possible to provide a further carrier on the side remote from the mounting face of the interconnection layer. In other words, the interconnection layer is in particular designed for electrical contacting, wherein auxiliary self-supporting components may be used for mechanical stabilization.

According to at least one embodiment of the optoelectronic semiconductor chip, each optoelectronic semiconductor body comprises a first region and a second region. The first region of each optoelectronic semiconductor body may be p-conductive in respect of its electrical conductivity. The second region of each optoelectronic semiconductor body may be n-conductive in respect of its electrical conductivity. In particular, the first region may also be n-conductive and the second region p-conductive. The first region and second region of each optoelectronic semiconductor body may in particular comprise a semiconductor material. In the present context, "semiconductor material" is understood to mean in particular a III/V semiconductor, II/VI semiconductor, nitride semiconductor and phosphide semiconductor. The selection of the semiconductor material is in this case in particular dependent on wavelengths of an electromagnetic radiation to be generated, which the optoelectronic semiconductor bodies are intended to emit via the active region.

According to at least one embodiment of the optoelectronic semiconductor chip, the active region is formed between the first region and the second region. This means that the active region which in the vertical direction is formed between the first region and the second region in particular generates electromagnetic radiation, the wavelength range of which may in particular be in the visible range.

According to at least one embodiment of the optoelectronic semiconductor chip, the first region of the optoelectronic semiconductor body is connected electrically conductively with the first electrically conductive contact layer and the second region of the optoelectronic semiconductor body is connected electrically conductively with the second electrically conductive contact layer. The connection between the first region of the optoelectronic semiconductor body and the first electrically conductive contact layer may in this case be p-conductive and the connection between the second region of the optoelectronic semiconductor bodies and the second electrically conductive contact layer may be n-conductive. The opposite assignment in terms of the p/n-conductive feature of the first region of the optoelectronic semiconductor body with the first electrically conductive contact layer and of the second region of the optoelectronic semiconductor body with the second electrically conductive contact layer is also possible.

According to at least one embodiment of the optoelectronic semiconductor chip, the active region of each optoelectronic semiconductor body has an opening and connects the second region electrically conductively with the second electrically conductive contact layer. This means that the active region of each optoelectronic semiconductor body is not of continuous construction in this embodiment. In other words, the opening extends completely through the first region of the optoelectronic semiconductor body and connects the second region of each optoelectronic semiconductor body electrically conductively with the second electrically conductive contact layer of the interconnection layer. This means that each optoelectronic semiconductor body comprises a face facing the interconnection layer which is configured such that the first region and the second region with the planar mounting face of the interconnection layer in each case electrically conductively provide first contacting and second contacting, wherein the first region is electrically insulated from the second region of each optoelectronic semiconductor body.

According to at least one embodiment of the optoelectronic semiconductor chip, the opening for contacting each optoelectronic semiconductor body with the interconnection layer is also provided by contacting via an outer face of the optoelectronic semiconductor body.

According to at least one embodiment of the optoelectronic semiconductor chip, an electrically insulating layer is formed between the interconnection layer and an electrically conductive chip carrier on a face of the interconnection layer remote from the mounting face. For further mechanical stabilization of the optoelectronic semiconductor chip, it is in particular possible to use an electrically conductive chip carrier, which is connected mechanically to the interconnection layer via the electrically insulating layer. The electrically insulating layer is in direct contact in particular in the vertical direction at its top with the interconnection layer and at its bottom with the electrically conductive chip carrier. The electrically insulating layer may be planar and constructed parallel to the mounting face of the interconnection layer.

According to at least one embodiment of the optoelectronic semiconductor chip, the electrically insulating layer is of planar configuration at the faces facing and remote from the optoelectronic semiconductor bodies. "Planar" means in the present context that the electrically insulating layer is in its vertical extent in particular free of topographic features, free of height differences and/or does not reproduce an underlying height profile, within the bounds of manufacturing tolerances. Moreover, the electrically insulating layer does not comprise any steps, edges or other raised portions or depressions at the faces facing and remote from the optoelectronic semiconductor bodies.

According to at least one embodiment of the optoelectronic semiconductor chip, the second electrically conductive contact layer is of continuous construction. This means that the second electrically conductive contact layer is in particular formed without interruption along the face of the interconnection layer remote from the planar mounting face. Each of the optoelectronic semiconductor bodies of the optoelectronic semiconductor chip is electrically connected via the same second electrically conductive contact layer. In other words, the optoelectronic semiconductor bodies are interconnected via a common cathode, wherein the second electrically conductive contact layer is n-conductive or metallic.

According to at least one embodiment of the optoelectronic semiconductor chip, the second electrically conductive contact layer projects beyond the interconnection layer at least in places in the lateral direction. This means that the second electrically conductive contact layer is free of the insulation layer at least in places and can be electrically contacted. In other words, the interconnection layer may be processed in such a way that the second electrically conductive layer is exposed. The region of the second electrically conductive contact layer which is free of the insulation layer may in particular display traces of removal of the insulating material of the insulation layer.

According to at least one embodiment of the optoelectronic semiconductor chip, the second electrically conductive contact layer in places penetrates the insulation layer as far as the mounting face. The second electrically conductive contact layer penetrates or passes right through the interconnection layer in the vertical direction. The openings are formed within the interconnection layer in the region of each optoelectronic semiconductor body. The second electrically conductive contact layer penetrates the insulation layer from the top thereof and terminates flush with the mounting face of the interconnection layer.

According to at least one embodiment of the optoelectronic semiconductor chip, a contacting region of the second electrically conductive contact layer and a contacting region of the first electrically conductive contact layer are arranged on the side of the interconnection layer facing the optoelectronic semiconductor bodies. The contacting region of the second electrically conductive contact layer and the contacting region of the first electrically conductive contact layer in particular form regions which may be provided for wire contacting. The contacting regions of the first and second electrically conductive contact layers have free faces or regions which are in particular not covered by the insulation layer. In other words, the contacting regions of the first and second electrically conductive contact layers are freely accessible from the direction of the optoelectronic semiconductor bodies. The contacting regions, formed in particular for wire contacting, of the first and second electrically conductive contact layers may in particular take the form of a bonding wire contact.

According to at least one embodiment of the optoelectronic semiconductor chip, the contacting region of the second electrically conductive contact layer and the contacting region of the first electrically conductive contact layer are arranged on the mounting face of the interconnection layer facing the optoelectronic semiconductor bodies. The contacting region of the second electrically conductive contact layer is arranged at the same level as the contacting region of the first electrically conductive contact layer. In other words, the mounting face comprises the contacting region of the second electrically conductive contact layer and the contacting region of the first electrically conductive contact layer, wherein the respective contacting regions are each assigned to the electrically conductive contact layers and in particular are electrically insulated from one another by the insulation layer and/or cutouts which may be filled with the further electrically insulating material. The contacting regions, formed for example for wire contacting, of the first and second electrically conductive contact layers may in particular be contacted by bonding wires.

According to at least one embodiment of the optoelectronic semiconductor chip, the contacting region of the second electrically conductive contact layer is formed on the side of the electrically conductive chip carrier remote from the mounting face and the electrically conductive chip carrier is in direct contact with the face of the interconnection layer remote from the mounting face. Electrical contacting on the side of the electrically conductive chip carrier remote from the optoelectronic semiconductor bodies here proceeds in particular via the second electrically conductive contact layer. This means that the second electrically conductive contact layer functions with the conductive chip carrier as a support and in particular forms the mechanically load-bearing component of the interconnection layer. In other words, the contacting region of the second electrically conductive contact layer is not located on the side of the interconnection layer facing the optoelectronic semiconductor body. It is particularly advantageous that, for example, high-precision methods of attaching the bonding wire can be dispensed with for contacting the second region, since the electrically conductive chip carrier may in particular be electrically contacted at all its exposed outer faces.

According to at least one embodiment of the optoelectronic semiconductor chip, the first electrically conductive contact layer is formed continuously between the optoelectronic semiconductor bodies. This means that the first electrically conductive contact layer is connected electrically conductively in particular without interruption with each of the optoelectronic semiconductor bodies and is formed at least in places on the planar mounting face of the interconnection layer. Each of the optoelectronic semiconductor bodies of the optoelectronic semiconductor chip is electrically connected via the same first electrically conductive contact layer. In other words, the optoelectronic semiconductor bodies are interconnected via a common anode, wherein the first electrically conductive contact layer may be p-conductive or metallic.

According to at least one embodiment of the optoelectronic semiconductor chip, the second electrically conductive contact layer is interrupted and the contacting region of the second electrically conductive contact layer and the contacting region of the first electrically conductive contact layer are arranged on the top of the interconnection layer facing the optoelectronic semiconductor bodies. This means that each of the optoelectronic semiconductor bodies may be driven individually via the contacting region of the first electrically conductive contact layer.

The contacting region of the second electrically conductive contact layer and the contacting region of the first electrically conductive contact layer in particular form regions which may be provided for wire contacting. The contacting regions of the first and second electrically conductive contact layers have free faces or regions which are in particular not covered by the insulation layer. In other words, the contacting regions of the first and second electrically conductive contact layers are freely accessible from the direction of the optoelectronic semiconductor bodies. The contacting regions, formed in particular for wire contacting, of the first and second electrically conductive contact layers may in particular take the form of bonding wire contacting.

According to at least one embodiment of the optoelectronic semiconductor chip, the contacting region of the first electrically conductive contact layer is formed on the face of the electrically conductive chip carrier remote from the mounting face and the electrically conductive chip carrier is contacted electrically with the first electrically conductive contact layer through the electrically insulating layer. The contacting region of the first electrically conductive contact layer is in particular formed on the electrically conductive chip carrier. Thus, for example, the anode terminal is located on a side of the interconnection layer remote from the mounting faces, wherein the electrically conductive chip carrier is electrically uninterruptedly contacted with the first electrically conductive contact layer by the electrically insulating layer and the electrically insulating layer electrically insulates the electrically conductive chip carrier from the second electrically conductive contact layer. In other words, the common anode terminal is located on the electrically conductive chip carrier of the interconnection layer and the contacting regions of the second electrically conductive contact layer are located on the side of the interconnection layer facing the optoelectronic semiconductor bodies.

According to at least one embodiment of the optoelectronic semiconductor chip, the insulation layer at least in places comprises one of the following materials: plastics material, resin, silicon dioxide, silicon nitride, aluminium oxide, titanium dioxide. In a further embodiment, the insulation region may also consist of one of the above-stated materials. Furthermore, these materials are in particular suitable for insulating the first region of the optoelectronic semiconductor body from the second region of the optoelectronic semiconductor body on formation of the opening in each of the optoelectronic semiconductor bodies.

BRIEF DESCRIPTION OF THE DRAWINGS

The optoelectronic semiconductor chip described here is explained below with reference to exemplary embodiments and the associated figures.

Exemplary embodiments of the optoelectronic semiconductor chip described here is explained in greater detail with reference to the schematic representations in FIGS. 1A, 1B, 1C and 2A, 2B and 3.

Figure 1A:
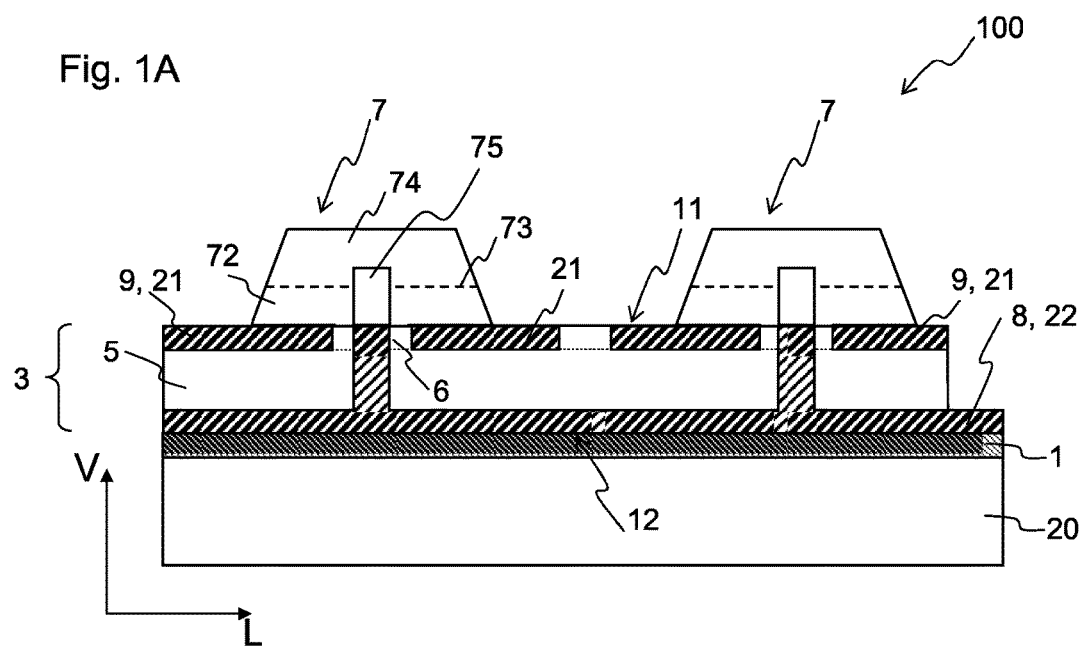

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1B:
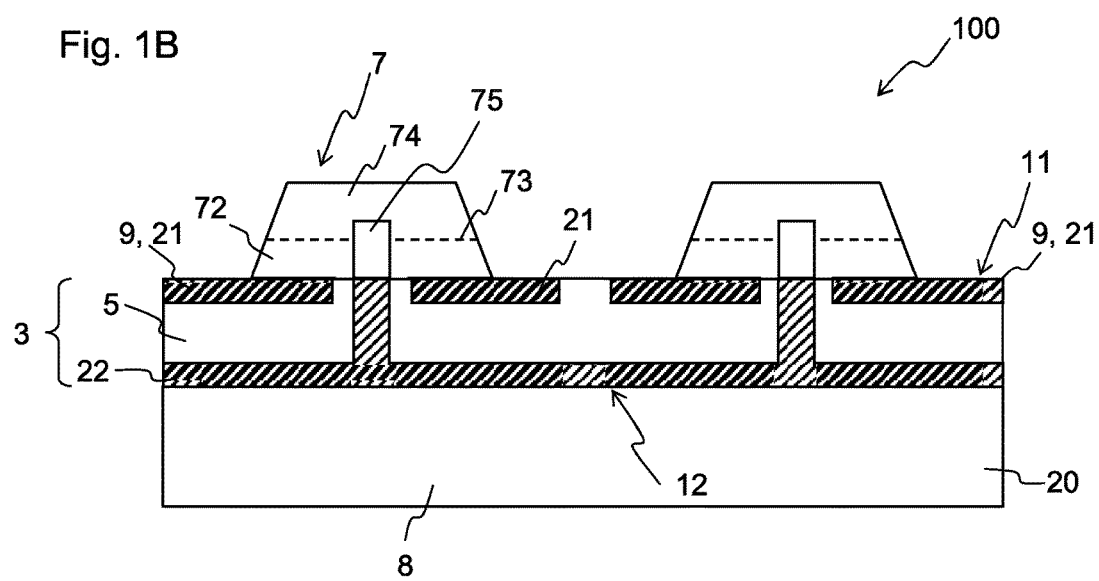
Figure 1C:
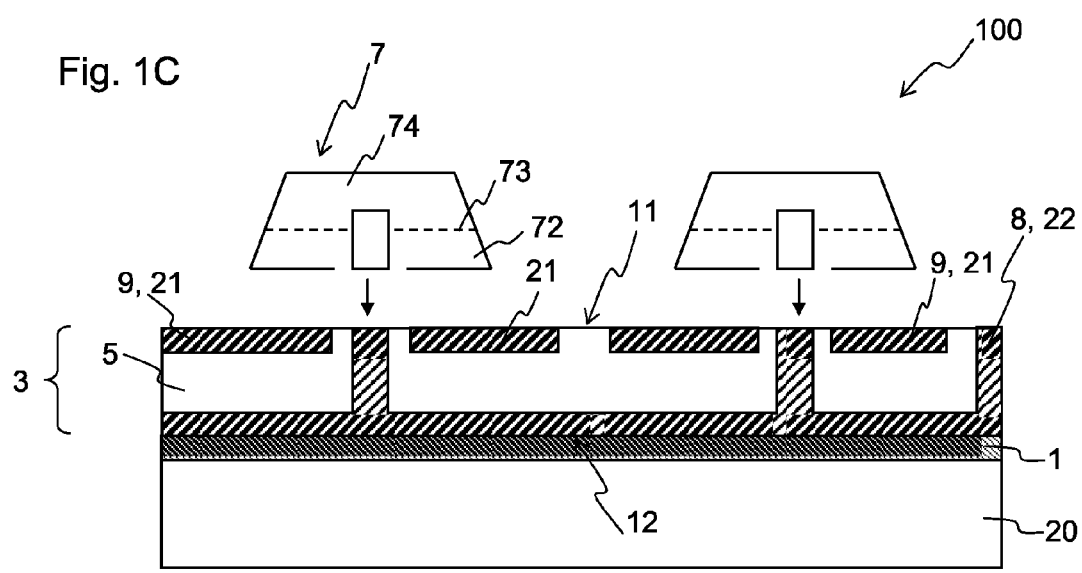

The exemplary embodiments of FIGS. 1A to C show schematic side views of the optoelectronic semiconductor chip with two optoelectronic semiconductor bodies interconnected in parallel via a continuous second electrically conductive contact layer (common cathode). The exemplary embodiments of FIGS. 2A and B show schematic side views of the optoelectronic semiconductor chip with two optoelectronic semiconductor bodies interconnected in parallel via a continuous first electrically conductive contact layer (common anode). FIG. 3 is a schematic plan view of a matrix interconnection of the optoelectronic semiconductor chip FIG. 1A shows, in a schematic side view, an optoelectronic semiconductor chip 100 described here comprising an interconnection layer 3 and two optoelectronic semiconductor bodies 7 each having an active region 73, which are interconnected in parallel. FIG. 1A additionally shows an electrically insulating layer 1, which is formed between the interconnection layer 3 and an electrically conductive chip carrier 20 on a bottom 12, remote from the mounting face 11, of a second electrically conductive layer 22. In FIG. 1A the interconnection layer comprises a first electrically conductive contact layer 21 and the second electrically conductive contact layer 22, an insulation layer 5 and cutouts 6, which may in particular be filled by a further insulating material. The insulation layer 5 may in particular be formed of an electrically insulating material.

In the exemplary embodiment of FIG. 1A, the second electrically conductive contact layer 22 is continuous. This means that the two optoelectronic semiconductor bodies 7, each having an active region 73, are interconnected in parallel by a second electrically conductive contact layer 22 formed jointly electrically conductively. The second electrically conductive contact layer 22 is connected electrically conductively to the second region 74 of the optoelectronic semiconductor bodies 7 via an opening 75 in each optoelectronic semiconductor body 7. The first electrically conductive contact layer 21 of the interconnection layer 3 is connected electrically conductively with the first region 72 of the optoelectronic semiconductor body 7.

In the exemplary embodiment in FIG. 1A, the first electrically conductive contact layer 21 may be a p-conductive contact layer and accordingly the first region 72 of the optoelectronic semiconductor body 7 may be a p-conductive region. Consequently, the second electrically conductive contact layer 22 is an n-conductive contact layer and accordingly the second region 74 of the optoelectronic semiconductor body 7 is an n-conductive region. The contacting region 8 of the second electrically conductive contact layer 22 projects beyond the interconnection layer 3 in the lateral direction. The contacting region 8 of the second electrically conductive contact layer 22 and the contacting region 9 of the first electrically conductive contact layer 21 are located on the side of the interconnection layer 3 facing the optoelectronic semiconductor bodies 7, wherein as a result of the interruption of the first electrically conductive contact layer 21 the contacting regions 9 are individually formed for each of the optoelectronic semiconductor bodies 7.

FIG. 1B is a schematic side view of an optoelectronic semiconductor chip 100 described here. Unlike in FIG. 1A, the optoelectronic semiconductor chip 100 of FIG. 1B does not display an electrically insulating layer 1. In FIG. 1B the second electrically conductive contact layer 22 is connected electrically conductively with the electrically conductive chip carrier 20. In other words, the contacting region 8 of the second electrically conductive contact layer 22 is located on the side of the electrically conductive chip carrier 20 remote from the mounting face 11. This means that the contacting region 8 of the second electrically conductive contact layer 22 is formed on the electrically conductive chip carrier 20. The contacting region 9 of the first electrically conductive contact layer 21 is located, as already described in relation to FIG. 1A, on the side of the interconnection layer 3 facing the optoelectronic semiconductor bodies.

Unlike in FIG. 1A, the exemplary embodiment of the optoelectronic semiconductor chip 100 shown in FIG. 1C shows that the contacting region 8 of the second electrically conductive contact layer 22 is located at the same level as the contacting region 9 of the first electrically conductive contact layer 21.

Figure 2A:
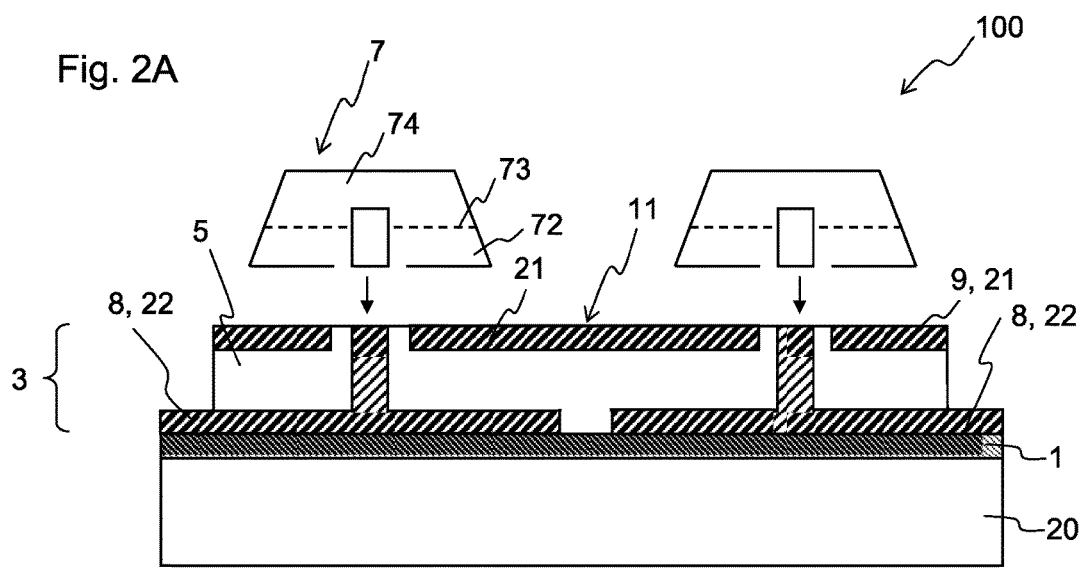

FIG. 2A is a schematic side view of an optoelectronic semiconductor chip 100 described here, comprising an interconnection layer 3 and two optoelectronic semiconductor bodies 7, which are interconnected in parallel via the first electrically conductive contact layer 21. In FIG. 2A the first electrically conductive contact layer of the interconnection layer 3 is continuous between the optoelectronic semiconductor bodies 7, wherein the second electrically conductive contact layer 22 comprises an interruption. The first electrically conductive contact layer 21 may take the form of a common anode and be p-conductive.

The interrupted second electrically conductive contact layer 22 is accordingly n-conductive. In FIG. 2A the contacting region 8 of the second electrically conductive contact layer 22 and the contacting region 9 of the first electrically conductive contact layer 21 are located on the side of the interconnection layer facing the optoelectronic semiconductor bodies, wherein as a result of the interruption of the second electrically conductive contact layer 22 the contacting regions 8 are formed individually for each of the optoelectronic semiconductor bodies 7.

Figure 2B:
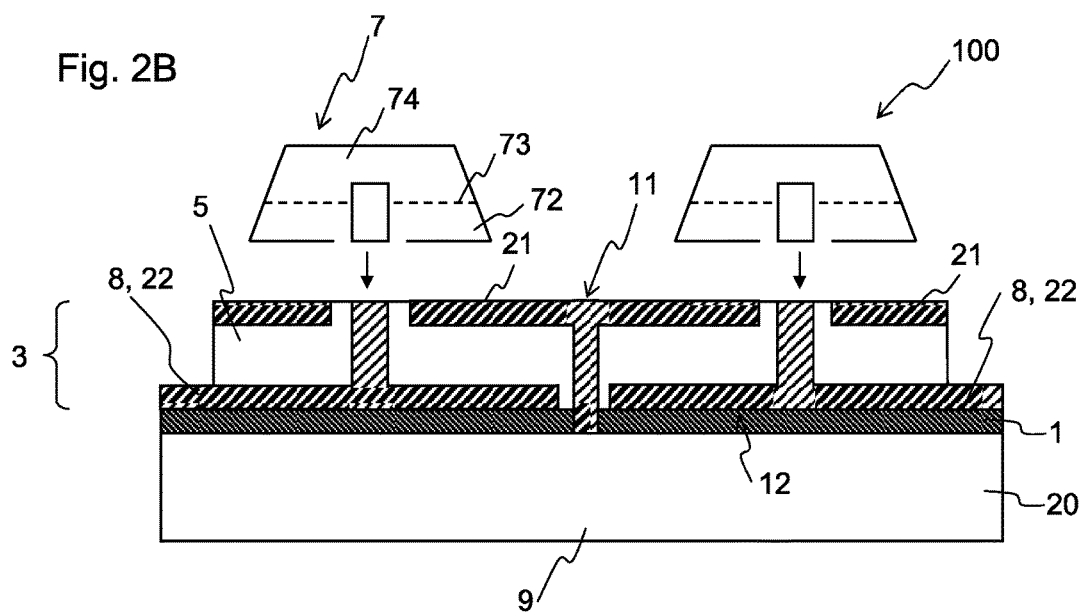

In FIG. 2B the first electrically conductive contact layer, as already described in relation to FIG. 2A, is continuous over the optoelectronic semiconductor body 7. The contacting region 9 of the first electrically conductive contact layer 21 is located on the face of the electrically conductive chip carrier 20 remote from the mounting face 11 of the interconnection layer 3, wherein the electrically insulating layer 1 is penetrated for the purpose of electrical contacting. As already described in relation to FIG. 2A, the contacting regions 8 of the second electrically conductive contact layer are present in duplicate.

In FIG. 3 a schematic plan view is used to describe an optoelectronic semiconductor chip 100 described here, wherein the optoelectronic semiconductor bodies 7 are arranged in rows and columns relative to one another in such a way as to form a matrix interconnection. In FIG. 3 the second electrically conductive contact layer 22 with its contacting regions 8 and the first electrically conductive contact layer 21 with its contacting regions 9 are each shown interrupted, wherein the first electrically conductive contact layer 21 has a through-via 10 in the region of the optoelectronic semiconductor bodies 7 for example for n-contacting between the two electrically conductive contact layers (21, 22).

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip comprising:
an interconnection layer with a mounting face, wherein the interconnection layer comprises a first electrically conductive contact layer, a second electrically conductive contact layer, and an insulation layer formed of an electrically insulating material that insulates the first and second electrically conductive contact layer from one another; and
two optoelectronic semiconductor bodies, wherein the mounting face faces the optoelectronic semiconductor bodies, wherein each of the optoelectronic semiconductor bodies comprises an active region designed to generate radiation,
wherein the insulation layer is arranged on a top of the second electrically conductive contact layer facing the optoelectronic semiconductor bodies,
wherein the first electrically conductive contact layer is arranged on a top of the insulation layer and remote from the second electrically conductive contact layer so that the insulation layer is located at least in places between the first and the second electrically conductive contact layer and the first and the second electrically conductive contact layer run at least in places parallel,
wherein the mounting face is entirely of a planar construction and spans completely over the interconnection layer,
wherein an electrically insulating layer is formed between the interconnection layer and a chip carrier on a face of the interconnection layer remote from the mounting face,
wherein the electrically insulating layer is of a planar construction on the faces remote from and facing the optoelectronic semiconductor bodies,
wherein a contacting region of the second electrically conductive contact layer is arranged on a top of the interconnection layer facing the optoelectronic semiconductor bodies so that the contacting region of the second electrically conductive contact layer is freely accessible from a direction of the optoelectronic bodies, the contacting region being located laterally besides the insulation layer and being located in a common plane with remaining parts of the second electrically conductive contact layer that run in parallel with the mounting face, and
wherein the optoelectronic semiconductor bodies are interconnected electrically in parallel by the interconnection layer.

2. The optoelectronic semiconductor chip according to claim 1, wherein the mounting face of the interconnection layer is formed with outer faces, facing the optoelectronic semiconductor bodies, of the first electrically conductive contact layer, the second electrically conductive contact layer and the insulation layer.

3. The optoelectronic semiconductor chip according to claim 1, wherein a surface, remote from the optoelectronic semiconductor bodies, of the second electrically conductive contact layer and the insulation layer is planar construction.

4. The optoelectronic semiconductor chip according to claim 1, wherein, at the top the first electrically conductive contact layer, the second electrically conductive contact layer and the insulation layer are in direct, seamless contact with one another over the entire top facing the optoelectronic semiconductor bodies.

5. The optoelectronic semiconductor chip according to claim 1, wherein the mounting face of the interconnection layer consists of outer faces, facing the semiconductor bodies, of the first electrically conductive contact layer, the second electrically conductive contact layer and the insulation layer.

6. The optoelectronic semiconductor chip according to claim 1, wherein:
each optoelectronic semiconductor body comprises a first region and a second region;
the active region is formed between the first region and the second region; and
the first region is connected electrically conductively with the first electrically conductive contact layer and the second region with the second electrically conductive contact layer.

7. The optoelectronic semiconductor chip according claim 1, wherein:
the active region of each optoelectronic semiconductor body has an opening; and
the opening connects the second region electrically conductively with the second electrically conductive contact layer.

8. The optoelectronic semiconductor chip according claim 1, wherein the chip carrier is electrically conductive.

9. The optoelectronic semiconductor chip according to claim 8, wherein:

a contacting region of the first electrically conductive contact layer is formed on the face of the electrically conductive chip carrier remote from the mounting face; and the electrically conductive chip carrier is electrically contacted with the first electrically conductive contact layer through the electrically insulating layer.

10. The optoelectronic semiconductor chip according to claim 1, wherein:

the second electrically conductive contact layer is continuous;

the second electrically conductive contact layer projects beyond the interconnection layer at least in places in a lateral direction;

the second electrically conductive contact layer penetrates the insulation layer in places as far as the mounting face; and a contacting region of the first electrically conductive contact layer is arranged on the top of the interconnection layer facing the optoelectronic semiconductor bodies.

11. The optoelectronic semiconductor chip according to claim 1, wherein the chip carrier is in direct contact with the face of the interconnection layer remote from the mounting face.

12. The optoelectronic semiconductor chip according to claim 1, wherein:

the first electrically conductive contact layer is continuous between the optoelectronic semiconductor bodies;

the second electrically conductive contact layer is interrupted; and the contacting region of the first electrically conductive contact layer is arranged on the top of the interconnection layer facing the optoelectronic semiconductor bodies.

13. The optoelectronic semiconductor chip according to claim 1, wherein the insulation layer comprises at least one material selected from the group consisting of plastics material, resin, silicon dioxide, silicon nitride, aluminum oxide, and titanium dioxide.

14. The optoelectronic semiconductor chip according to claim 1, wherein the second electrically conductive contact layer is continuous, contiguous and free of interruptions.

15. The optoelectronic semiconductor chip according to claim 1, wherein the interconnection layer, the optoelectronic semiconductor bodies, the electrically insulating layer and the chip carrier form the optoelectronic semiconductor chip.

16. An optoelectronic semiconductor chip comprising:

an interconnection layer with a mounting face, wherein the interconnection layer comprises a first electrically conductive contact layer, a second electrically conductive contact layer, and an insulation layer formed of an electrically insulating material that insulates the first and second electrically conductive contact layers from one another; and two optoelectronic semiconductor bodies, wherein the mounting face faces the optoelectronic semiconductor bodies, wherein each of the optoelectronic semiconductor bodies comprises an active region which is intended for generating configured to generate radiation, wherein the insulation layer is arranged on a top of the second electrically conductive contact layer facing the optoelectronic semiconductor bodies, wherein the first electrically conductive contact layer is arranged on a top of the insulation layer remote from the second electrically conductive contact layer so that the insulation layer is located at least in places between the first and the second electrically conductive contact layer and the first and the second electrically conductive layer run at least in places parallel, wherein the mounting face is entirely planar construction and spans completely over the interconnection layer, wherein the optoelectronic semiconductor bodies are interconnected electrically in parallel by the interconnection layer, wherein the second electrically conductive contact layer is continuous, contiguous and free of interruptions and completely covers a side of the interconnection layer remote from the mounting face, and wherein the second electrically conductive contact layer penetrates the insulation layer in places as far as the mounting face.

17. An optoelectronic semiconductor chip comprising:

an interconnection layer with a first electrically conductive contact layer, a second electrically conductive contact layer, and an insulation layer, which is formed of an electrically insulating material; and two optoelectronic semiconductor bodies, wherein each of the optoelectronic semiconductor bodies comprises an active region which is intended for generating configured to generate radiation, wherein the insulation layer is arranged on a top of the second electrically conductive contact layer facing the optoelectronic semiconductor bodies, wherein the active region of each optoelectronic semiconductor body has an opening and the opening connects a second region of the optoelectronic body electrically conductively with the second electrically conductive contact layer, the second region being located on a side of the active region remote from the interconnection layer, wherein the first electrically conductive contact layer is arranged on a top of the insulation layer remote from the second electrically conductive contact layer, wherein the optoelectronic semiconductor bodies are interconnected electrically in parallel by the interconnection layer, wherein a mounting face of the interconnection layer is entirely planar construction and spans completely over the interconnection layer, and wherein the mounting face comprises consists of outer faces of the first electrically conductive contact layer, the second electrically conductive contact layer and the insulation layer facing the optoelectronic semiconductor bodies, wherein each of the optoelectronic semiconductor bodies is directly disposed on a part of the first and second electrically conductive contact layer, wherein, when seen in a cross-section perpendicular with the mounting face, each of the semiconductor bodies completely covers in a central section a respective part of the second electrically conductive contact layer and only partially covers two respective parts of the first electrically conductive contact layer, on the mounting face the two parts of the first electrically conductive contact layer enclose the respective part of the second electrically conductive contact layer.

18. The optoelectronic semiconductor chip according to claim 17, wherein the interconnection layer and the optoelectronic semiconductor bodies form the optoelectronic semiconductor chip.

* * * * *

UNITED STATES PATENT AND TRADEMARK OFFICE
CERTIFICATE OF CORRECTION

PATENT NO. : 9,589,939 B2
APPLICATION NO. : 14/407891
DATED : March 7, 2017
INVENTOR(S) : Norwin von Malm It is certified that error appears in the above-identified patent and that said Letters Patent is hereby corrected as shown below:

In the Claims

In Column 12, Line 34, Claim 3, delete "the insulation layer is planar construction" and insert --the insulation layer is of planar construction--.

In Column 13, Line 61-62, Claim 16, delete "which is intended for generating configured to generate radiation" and insert --which is configured to generate radiation--.

In Column 14, Line 6, Claim 16, delete "the mounting face is entirely planar construction" and insert --the mounting face is entirely of planar construction--.

In Column 14, Line 25-26, Claim 17, delete "which is intended for generating configured to generate radiation" and insert --which is configured to generate radiation--.

In Column 14, Line 44, Claim 17, delete "entirely planar construction" and insert --entirely of planar construction--.

In Column 14, Line 46-47, Claim 17, delete "the mounting face comprises consists of outer faces" and insert --the mounting face comprises outer faces--.

Signed and Sealed this
Fifth Day of December, 2017

Joseph Matal
*Performing the Functions and Duties of the
Under Secretary of Commerce for Intellectual Property and
Director of the United States Patent and Trademark Office*